United States Patent [19]

McCullough

[11] Patent Number: 6,093,961
[45] Date of Patent: Jul. 25, 2000

[54] HEAT SINK ASSEMBLY MANUFACTURED OF THERMALLY CONDUCTIVE POLYMER MATERIAL WITH INSERT MOLDED METAL ATTACHMENT

[75] Inventor: Kevin A. McCullough, Warwick, R.I.

[73] Assignee: Chip Coolers, Inc., Warwick, R.I.

[21] Appl. No.: 09/256,800

[22] Filed: Feb. 24, 1999

[51] Int. Cl.[7] .............................. H05K 7/20; H01L 23/40; H01L 23/36; F28F 7/00
[52] U.S. Cl. ......................... 257/718; 257/719; 257/722; 257/712; 257/726; 257/727; 174/16.3; 361/704; 361/697; 438/117
[58] Field of Search .................................... 257/712, 713, 257/718, 719, 722, 726, 727; 174/16.3; 361/697, 701–704, 712, 717–719, 722; 438/117

[56] References Cited

U.S. PATENT DOCUMENTS

| | | | |
|---|---|---|---|
| 4,978,638 | 12/1990 | Buller et al. | 29/825 |
| 5,299,632 | 4/1994 | Lee | 165/80.3 |
| 5,430,610 | 7/1995 | Hung | 361/697 |
| 5,598,322 | 1/1997 | Arx et al. | 361/704 |
| 5,660,562 | 8/1997 | Lin | 439/487 |
| 5,724,228 | 3/1998 | Lee | 361/697 |
| 5,774,335 | 6/1998 | Pare et al. | 361/704 |
| 5,808,869 | 9/1998 | Donahoe et al. | 361/704 |
| 5,825,622 | 10/1998 | Rife et al. | 361/704 |
| 5,893,409 | 4/1999 | Kohler et al. | 165/80.3 |

*Primary Examiner*—Alexander O. Williams
*Attorney, Agent, or Firm*—Barlow, Josephs & Holmes, Ltd.

[57] ABSTRACT

An molded heat sink assembly includes an integrally molded attachment clip for securing the assembly to a semiconductor package to be cooled. The assembly removes heat from a semiconductor device package having opposing side wall edges. The heat sink assembly also includes a heat conductive base member having a substantially flat bottom surface adapted to be positioned in flush thermal communication with a heat generating semiconductor device package. A number of heat dissipating elements are connected to and extend upwardly from the thermally conductive base member. A pair of semiconductor package engaging clips downwardly depend from and are integrally connected to opposing sides of the heat conductive base member. The engaging clips are disposed in gripping communication with respective opposing side wall edges of the semiconductor device package.

2 Claims, 4 Drawing Sheets

HEAT SINK ASSEMBLY MANUFACTURED OF THERMALLY CONDUCTIVE POLYMER MATERIAL WITH INSERT MOLDED METAL ATTACHMENT

BACKGROUND OF THE INVENTION

The present invention relates generally to electronic solid state and integrated circuit devices. More specifically, the present invention relates to apparatuses for dissipating heat generated by such devices.

In the electronics and computer industries, it has been well known to employ various types of electronic device packages and integrated circuit chips, such as the PENTIUM central processing unit chip (CPU) manufactured by Intel Corporation and RAM (random access memory) chips. These integrated circuit chips have a pin grid array (PGA) package and are typically installed into a socket which is soldered to a computer circuit board. These integrated circuit devices, particularly the CPU microprocessor chips, generate a great deal of heat during operation which must be removed to prevent adverse effects on operation of the system into which the device is installed. For example, a PENTIUM microprocessor, containing millions of transistors, is highly susceptible to overheating which could destroy the microprocessor device itself or other components proximal to the microprocessor.

In addition to the PENTIUM microprocessor discussed above, there are many other types of semiconductor device packages which are commonly used in computer equipment, for example. Recently, various types of surface mount packages, such as BGA (ball grid array) and LGA (land grid array) type semiconductor packages have become increasingly popular as the semiconductor package of choice for computers.

Also, microprocessors are commonly being installed onto a circuit board which is, in turn, installed into a motherboard or other similar primary circuit board. For example, microprocessors, such as the Pentium II and the Celeron from Intel, are "processor cards" which are installed into a motherboard of a computer in similar fashion to the way a modem is installed into a motherboard. On a given processor card is typically the processor semiconductor device package itself along with any other chips or semiconductor devices that are necessary for the operation of the card, such cache chips, or the like. The processor package may be installed into the processor card via a pin grid, ball grid, land grid array and with a socket such as a ZIF or ball grid socket.

In similar fashion to the earlier semiconductor devices discussed above, the processor cards like the Pentium II and Celeron also suffer from excessive generation of heat. In particular, the processor semiconductor device package on the card generates the heat which is of most concern. A given surface of the component will, as a result, be very hot. If such heat is not properly dissipated, the processor semiconductor device package and the entire processor card or component will eventually fail.

In view of the foregoing, efforts have been made to supply a heat dissipating member, such as a heat sink, into thermal communication with a semiconductor device package. These efforts typically include the employment of a block heat sink member, such as an extruded aluminum member with upstanding pins, along with a separate steel spring clip to maintain the heat sink in thermal communication with the semiconductor device package. Prior art attempts also include separate clips that embrace the semiconductor package with a heat sink member that either snaps or threads into the clips to complete the assembly.

The foregoing heat sink assemblies of the prior art suffer from the disadvantages of having multiple components and the high cost associated therewith. These multiple component heat sink assemblies typically include expensive machined or extruded heat conductive metal, such as aluminum. Other parts, such as springs or addition clips require separate machining steps and/or molds for production.

In view of the foregoing, there is a demand for a heat sink assembly that attaches to a heat generating semiconductor device package. There is a demand for a heat sink assembly can be easily formed into a single member with no separate parts. In addition, there is a demand for complete heat sink assembly to be completely molding from a unitary body of thermally conductive moldable composition.

SUMMARY OF THE INVENTION

The present invention preserves the advantages of prior art heat sink assemblies for integrated circuit devices, such as microprocessors. In addition, it provides new advantages not found in currently available assemblies and overcomes many disadvantages of such currently available assemblies.

The invention is generally directed to the novel and unique heat sink assembly with particular application in cooling microprocessor integrated circuit devices, such as semiconductor device package. The heat sink assembly of the present invention enables the simple, easy and inexpensive assembly, use and maintenance of a heat sink assembly while realizing superior heat dissipation.

An molded heat sink assembly includes an integrally molded attachment clip device. The assembly removes heat from a semiconductor device package having opposing side wall edges. The heat sink assembly also includes a heat conductive base member having a substantially flat bottom surface adapted to be positioned in flush thermal communication with a heat generating semiconductor device package. A number of heat dissipating elements are connected to and extend upwardly from the thermally conductive base member. A pair of semiconductor package engaging clips downwardly depend from and are integrally connected to opposing sides of the heat conductive base member. The engaging clips are disposed in gripping communication with respective opposing side wall edges of the semiconductor device package.

In operation, the integral heat sink and clip arrangement is positioned over the semiconductor device package to be cooled. Integrally formed clips on opposing sides of the heat sink assembly are urged over the opposing edges of the semiconductor device itself. Inwardly turned flanges of the clips embrace the semiconductor device package and secure the heat sink assembly thereto for flush thermal communication. In an alternative embodiment, elongated clips are pivotally connected to opposing side of the base. When extension portions of the clips are squeezed together, the package engaging portions of the clips open up permitting receipt of a semiconductor device package therebetween.

It is therefore an object of the present invention to provide a complete heat sink assembly that can accommodate a wide array of types of semiconductor device packages.

It is an object of the present invention to provide a complete heat sink assembly that includes an integrated structure for securing a heat dissipating member to a semiconductor device package.

It is a further object of the present invention to provide a heat sink assembly that includes an integrally molded clip.

Another object of the present invention is to provide a complete heat sink assembly that is manufactured of a thermally conductive moldable polymer.

It is a further object of the present invention to provide a heat sink assembly can be installed without additional tools.

It is yet a further object of the present invention to provide a heat sink that can attach to and cool a heat generating surface.

BRIEF DESCRIPTION OF THE DRAWINGS

The novel features which are characteristic of the present invention are set forth in the appended claims. However, the inventions preferred embodiments, together with further objects and attendant advantages, will be best understood by reference to the following detailed description taken in connection with the accompanying drawings in which:

DETAILED DESCRIPTION OF THE PREFERRED EMBODIMENT

The present invention provides a heat sink assembly 10 for attachment to a wide range of types of semiconductor device packages. These packages may or may not be attached to a circuit board such as a motherboard or daughter card. The present invention is shown in the Figures as attaching to a ball grid array (BGA) surface mount semiconductor device package is for illustration purposes only. It should be understood that various other types of semiconductor packages may be installed on a circuit board and accommodated by the present invention. For example, the present invention may accommodate pin grid array (PGA) packages as well as land grid array (LGA) packages.

Figure 1:
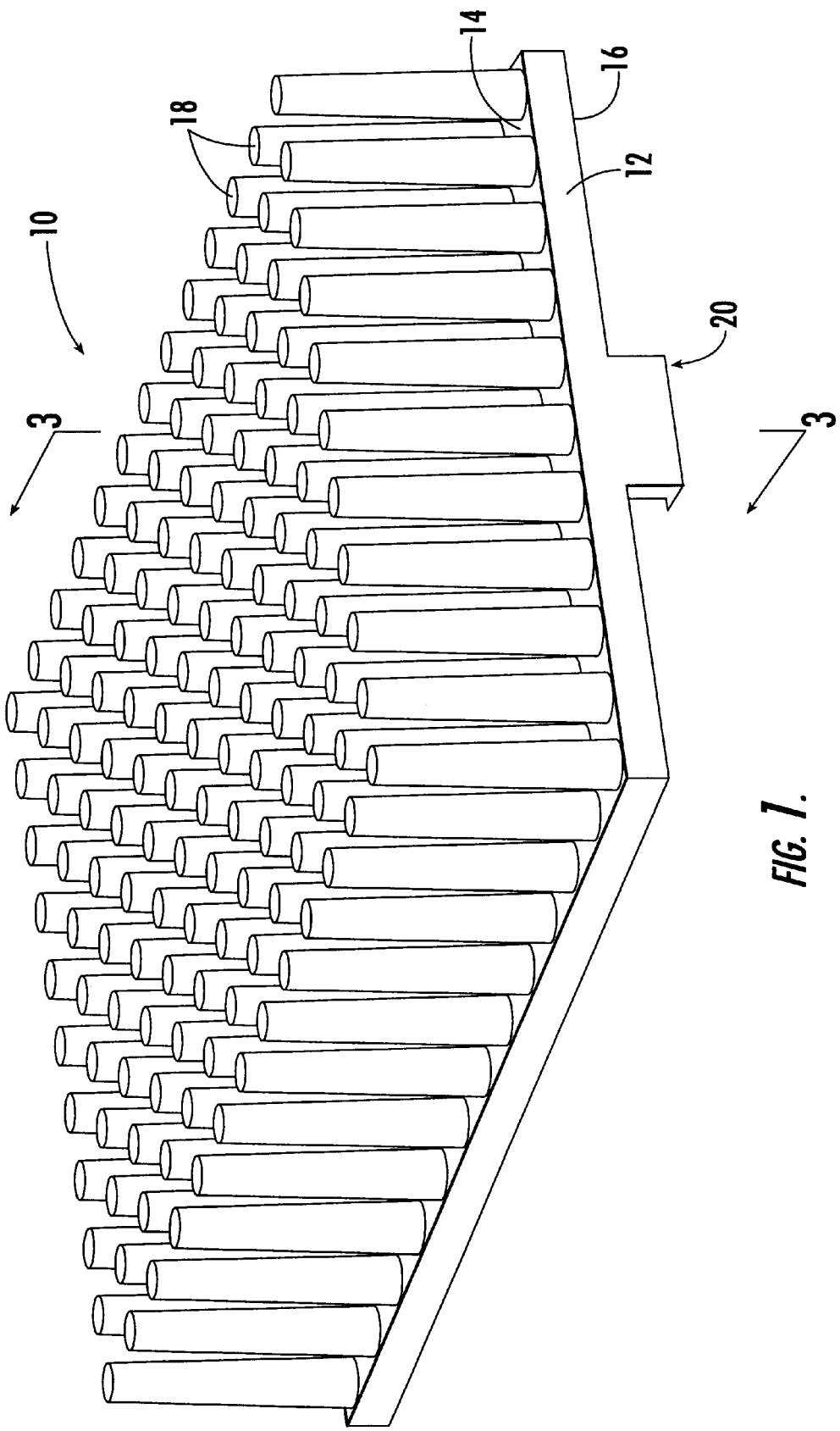
FIG. 1 is an perspective view of the heat sink assembly of the present invention.
Figure 2:
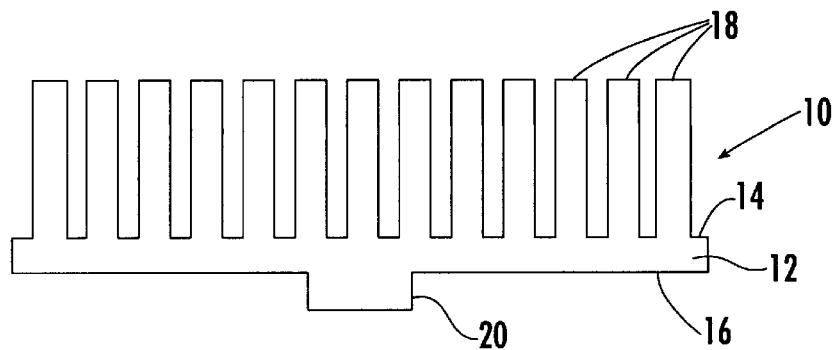
FIG. 2 is an end view of the heat sink assembly of the present invention of FIG. 1.

Referring first to FIG. 1, a perspective view of the preferred embodiment of the integrally molded heat dissipating member and clip assembly 10 of the present invention is shown. This heat sink assembly 10 includes a base member 12 having a top surface 14 and bottom surface 16. Emanating upwardly from the top surface are a number of pin structures serving as heat dissipating members for dissipating heat into the ambient air. Downwardly depending from the base member 12 are a number of clips 20 which will be discussed in more detail in connection with FIGS. 3 and 4. FIG. 2 illustrates a side view of the heat sink assembly 10 of the present invention where clips 20 are integrally formed with the actual base member 12.

Figure 3:
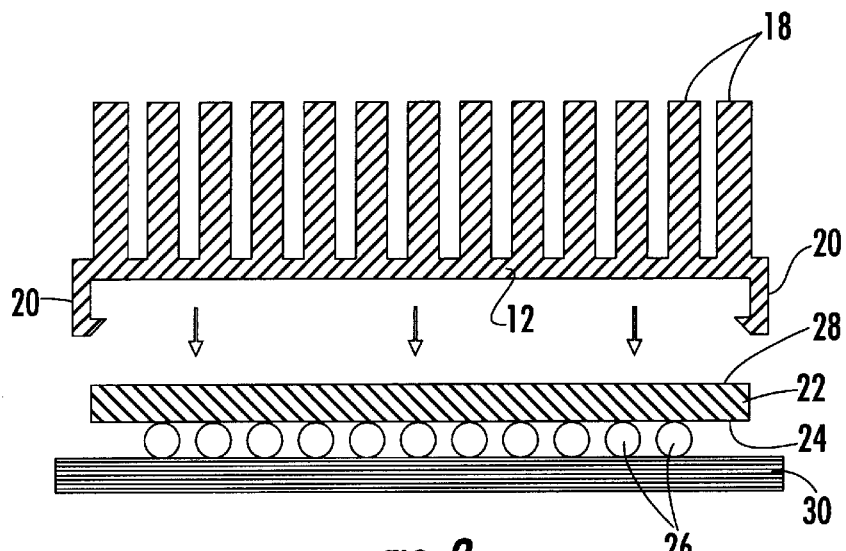
FIG. 3 is a cross-sectional view through the line 3—3 of FIG. 1 illustrating installation of the heat sink of the present invention onto a semiconductor device package installed on a circuit board.
Figure 4:
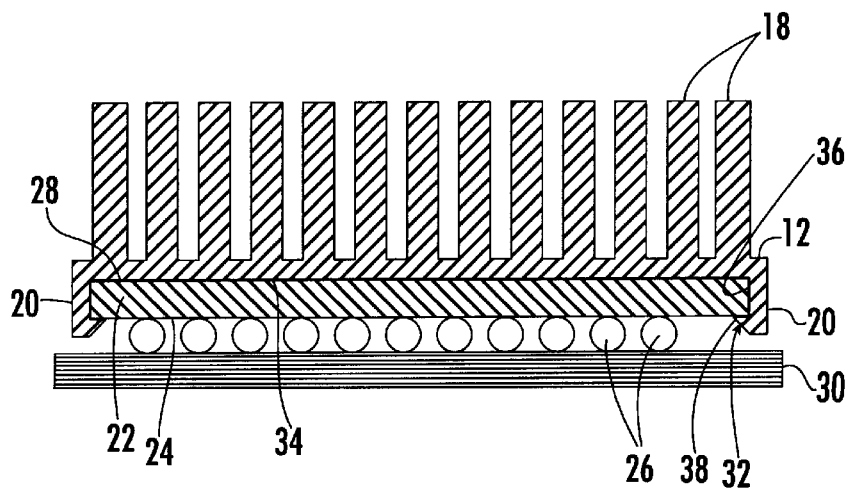
FIG. 4 is an assembled cross-sectional view of the heat sink assembly of the present invention installed on a semiconductor device package.

Turning now to FIGS. 3 and 4, details of the construction of the heat sink assembly 10 of the present invention as well as installation to a semiconductor device package 22 is shown. FIG. 3 is illustrates a general cross-sectional view through the line 3—3 of FIG. 1 along with a cross-section of a semiconductor device package 22 to shown the general installation of the heat sink assembly 10 of the present invention. In particular, semiconductor package 22 includes a bottom surface 24 with a number of electrical interconnections thereon, such as solder balls 26 as shown. Alternatively, semiconductor device package 22 may be of a pin grid array configuration where an array of pins (not shown) are employed instead of the ball array 26. As stated above, the semiconductor package 22 tends to run at high temperatures. More specifically, it is the top surface 28 that is particularly hot and needs heat dissipation. FIG. 3 illustrates the installation and attachment of the heat sink assembly 10 of the present invention to the semiconductor device package 22 installed on a circuit board 30.

The base member 12 of the heat sink assembly 10 includes a pair of downwardly depending legs 20 which have lower free ends 30. Connected to each of the legs 20 are inwardly turned flanges 32. The general space defined by the bottom surface 34 of the base member 12 and the downwardly depending legs 20 will accommodate the semiconductor device 22. The inwardly turned flanges 32 engage with the bottom surface 24 of the semiconductor device package 22 while the inner side walls 36 of the downwardly depending legs 20 embrace the outer side walls of the semiconductor package 22. In this arrangement, heat dissipating members 18 emanate upwardly into the air for optimum heat exchange from the base member 12.

Referring now to both FIGS. 3 and 4, the installation of the preferred embodiment of the present invention is shown. The integral heat sink assembly 10, with heat dissipating base 12 and pin members 18 as well as the legs 20 is, as one unit, snapped onto the semiconductor device package 22 to be cooled. Each of the inwardly turned flanges 32 include a cam surface 38 to cam out the legs 20 when the heat sink assembly 10 is pressed downwardly onto the semiconductor device package 22. The legs 20, due to being of a slightly flexible yet resilient material, are capable of flexing outwardly while being spring-biased in a downward direction. The angle cam surfaces 38 contact the outer opposing edges of the semiconductor device package 22 to permit the flanges 32 to completely clear under the semiconductor package 22 upon further downward installation. FIG. 4 shows complete installation of the heat sink assembly 10 onto a semiconductor device package 22. As can be seen, the flanges 32 have passed below the lower surface 24 of the semiconductor device package 22 so that the inner side walls 36 of the legs 20 and the upper surface of the flanges 32 embrace the semiconductor device package 22. In particular, the upper surface 28 of semiconductor device package 22 is now maintained in direct flush thermal communication with the bottom surface 34 of the base member 12 of the heat sink assembly 10.

The thickness of the flanges 32 are selected to be relatively thin to permit the embracing of the semiconductor device package 22 even if the package 22 is mounted very close to the circuit board 30. The preferred embodiment of the present invention 10 is shown with a pair of opposing integral leg arrangements 20 for securing the heat dissipating base member 12 to the semiconductor device package 10. It is considered part of the present to employ other arrangements of legs 20. For example, an arrangement of four or 8 legs and corresponding securing structures is contemplated by the present invention and may be employed depending on the application at hand. In addition, the employment of inwardly turned flanges 32 are also shown by way of example. Other integrated leg structures may be employed such as a windowed configuration for engaging a protrusion of a ZIF socket or a leg that snaps into a leg in a circuit board. Applicant's invention includes a heat dissipating member with an integrally provided structure for securing the heat dissipating member to a heat generating semiconductor device package.

Figure 5:
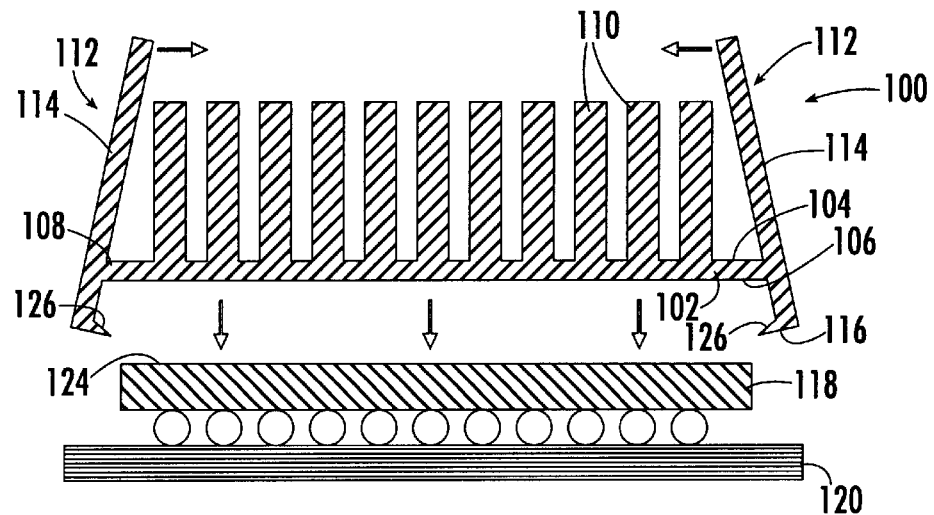
FIG. 5 is a cross-sectional view of an alternative embodiment of the present invention.
Figure 6:
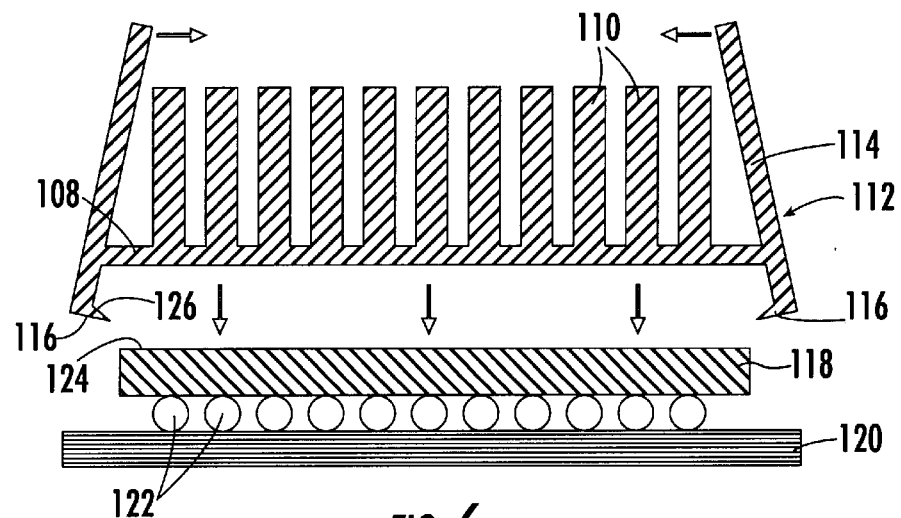
FIG. 6 a cross-sectional view illustrating installation of the heat sink of the alternative embodiment of the present invention onto a semiconductor device package.
Figure 7:
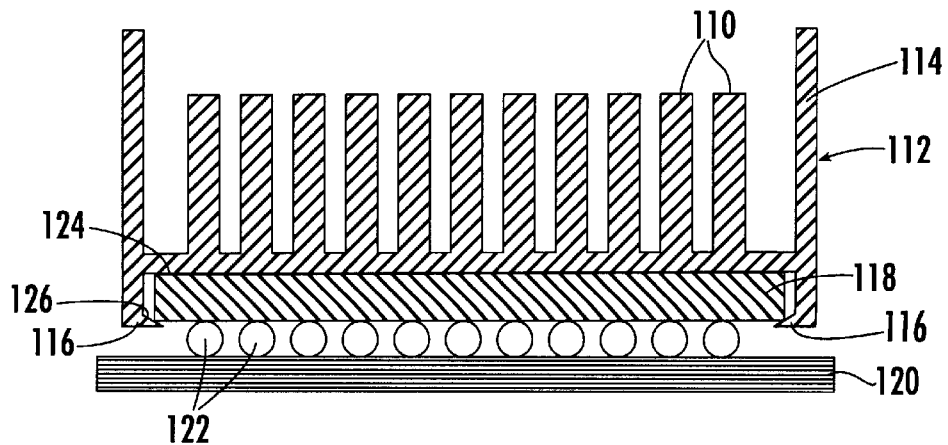
FIG. 7 is a cross-sectional view of the alternative embodiment of FIG. 5 fully installed on a semiconductor device package.

Turning now to FIGS. 5–7, an alternative embodiment 100 of the present invention is shown. FIG. 5 illustrates a general cross-sectional view of an alternative embodiment of the heat sink assembly 100 of the present invention. In particular, the heat sink assembly 100 includes a base member 102 with a top surface 104 and bottom surface 106 as well as side edges 108. Emanating upwardly from the top surface 104 of the base member 102 are a number of heat dissipating elements 110 which are shown, by way of example, as pin elements. Connected to opposing edges of the heat sink assembly 100 are, preferably, a pair of elongated clip members 112. Each of the clip members 112 include an elongated armature 114 which extends above the top surface 104 of the base member 102. This armature 114 also extends below the bottom surface 106 of the base 102 a preselected distance. At the lower free end of the elongated clip member is an inwardly turned flange 116 for embracing a semiconductor device package 118.

FIGS. 6 and 7 illustrate the details and installation of the alternative embodiment 100 of the present invention. The elongated clip members 112 are pivotally connected to opposing sides of the base member 102 of the heat sink assembly 100. Upon pinching or squeezing the upper portions of the clip assemblies 112 toward one another, the flange portions 116 of the clip members 112 move away from one another due to the pivot action at the junction at the opposing edges of the base member 102. The outward movement of the flanges 116 permits the entire unitary heat sink assembly 100 to be lowered directly over the semiconductor device package 118 to be cooled even when package 118 is already installed on circuit board 120 via solder ball interconnections 122. In particular, the outward movement of the flanges 116 permit the flanges 116 to clear the outer edges of the semiconductor device package 118 when the entire heat sink assembly 100 is lowered thereon. Once the bottom surface 106 of the base member 102 communicates with the top surface 124 of the semiconductor device package 118 the top portions of the clips members 112 can be released. Since the clip members 112 are spring-biased to a vertical position, the release of the clip members 112 will cause the top portions of clip members 112 to move outwardly thus causing the flanges 116 and inner wall surfaces to move toward the semiconductor device package 118. As seen in FIG. 7, the release of the clip members 112 causes the semiconductor device package 118 to be clamped with the clip members 112 and the bottom surface 106 of the base member 102 while still being installed in the circuit board 120.

As best seen in FIGS. 6 and 7, the clip members 112 also include inwardly turned flanges 116 that include an angled surface 126 that engages with the lower outer edge of the semiconductor device package 118 to be cooled. The angled surface 126 combined with the spring-biasing of the clip members 112 urges the semiconductor device package 118 upwardly into the base member 102 thus ensuring quality flush thermal communication between the heat sink assembly 100 and the semiconductor device package 118 to be cooled. As a result, additional steel springs or tension devices are not needed to maintain thermal contact with the heat sink assembly 100.

Figure 8:
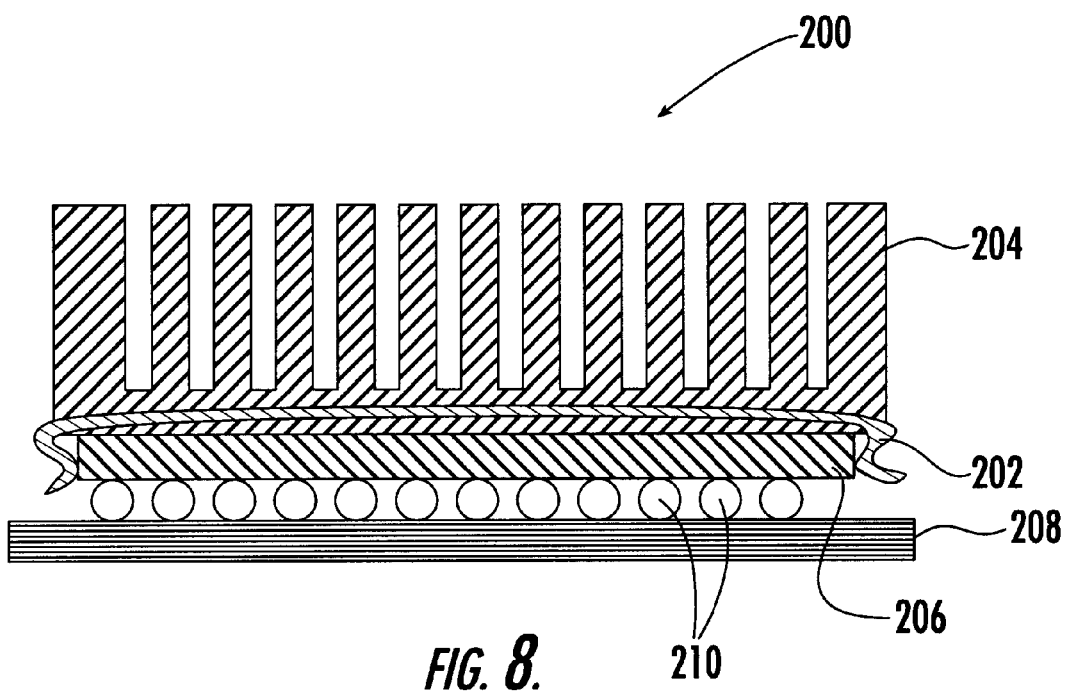
FIG. 8 is a cross-sectional view of another alternative embodiment of the present invention illustrating a separate clip insert molded into the heat dissipating body.

A further alternative embodiment 200 is shown in FIG. 8 which includes a separate spring clip 202 insert molded into the body of the heat dissipating member 204. In particular, FIG. 8 illustrates a cross-section of this alternative embodiment 200 of the heat sink assembly. Through various known insert molding techniques, the separate clip 202 may be incorporated into the mold of the heat sink assembly 200. It is preferred that this separate spring member 202 be manufactured with the same thermally conductive mold material as the remainder of the assembly 200. Alternatively, the separate spring clip 202 member may be of a different material such as steel. The spring member 202 embraces the outer edges of semiconductor device package 206 which is installed on a circuit board 208 via interconnections 210.

The present invention has a wide range of applications and can be easily adapted for such applications. Further applications include any circuit board configuration where a heat generating device is provided on a circuit board or similar substrate and where a receiving structure. The present invention may be easily adapted to an application where the circuit board containing the heat generating device is encased in a housing, such as a Pentium II configuration. In this arrangement (not shown), both the preferred embodiment and the alternative embodiments my be modified to accommodate such a package. In this configuration, the flanges and clip member are be arranged with a greater distance to the bottom of the base member to accommodate a wider or thicker package.

It is preferred that the present invention be manufactured from a unitary molded member of a thermally conductive polymer or the like. For example, a polymer base matrix loaded with conductive filler material, such as carbon fiber, may be employed as the material for the present invention. The entire heat sink assembly, including flanges, legs and clip members, are preferably molded from a single mold with the same conductive material. Such unitary construction is unlike that found in the prior and provides significant advantages including low cost, ease of manufacture and flexibility of heat geometry due to the ability to mold the assembly as opposed to machining it. Fins are illustrated in a pin grid configuration but various other heat sink fin configurations, such as a radial fin array, may be employed.

It would be appreciated by those skilled in the art that various changes and modifications can be made to the illustrated embodiments without departing from the spirit of the present invention. All such modifications and changes are intended to be covered by the appended claims.

What is claimed is:

1. An insert molded heat sink assembly for removing heat from a semiconductor device package having opposing side wall edges, comprising:

a metallic clip member having a main body portion with a first side and a second side opposing said first side; said metallic clip further including a first leg downwardly depending from said first side of said main body and having a free end with an inwardly directed first flange connected to said free end of said first leg; and a second leg downwardly depending from said second side of said main body and having a free end with an inwardly directed second flange connected to said free end of said second leg;

a base member of thermally conductive moldable polymer material; said base member having a bottom surface and a top surface; said metallic clip member being embedded within said base member with said first leg and said second leg emanating below said bottom surface of said base member; said base member further including a plurality of integrally formed heat dissipating elements emanating upwardly from said top surface of said base member; said heat dissipating elements being of the same thermally conductive moldable polymer material as said base member;

whereby said first leg and said second leg, respectively, embrace the opposing side wall edges of a semiconductor device package to place the bottom surface of said base member into thermal communication with said semiconductor device package.

2. A method of manufacturing a heat sink assembly for removing heat from a semiconductor device package having opposing side wall edges, comprising the steps of:

providing a metallic clip member having a main body portion with a first side and a second side opposing said first side; said metallic clip further including a first leg downwardly depending from said first side of said main body and having a free end with an inwardly directed first flange connected to said free end of said first leg;

and a second leg downwardly depending from said second side of main body and having a free end with an inwardly directed second flange connected to said free end of said second leg;

molding a base member of thermally conductive moldable polymer material; said base member having a bottom surface and a top surface; and insert molding said metallic clip member within said base member with said first leg and said second leg emanating below said bottom surface of said base member; and forming a plurality of heat dissipating elements emanating upwardly from said top surface of said base member and integrally formed with said base member; said heat dissipating elements being of the same thermally conductive moldable polymer material as said base member.

* * * * *